(12) United States Patent
Blank et al.

(10) Patent No.: US 10,374,078 B2
(45) Date of Patent: Aug. 6, 2019

(54) SEMICONDUCTOR DEVICES AND A METHOD FOR FORMING A SEMICONDUCTOR DEVICE

(71) Applicant: Infineon Technologies Austria AG, Villach (AT)

(72) Inventors: Oliver Blank, Villach (AT); Britta Wutte, Feistritz (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/455,965

(22) Filed: Mar. 10, 2017

(65) Prior Publication Data

US 2017/0263756 A1    Sep. 14, 2017

(30) Foreign Application Priority Data

Mar. 11, 2016    (DE) .................. 10 2016 104 520

(51) Int. Cl.

| H01L 29/78 | (2006.01) |
|---|---|
| H01L 29/10 | (2006.01) |
| H01L 29/40 | (2006.01) |
| H01L 29/66 | (2006.01) |
| H01L 29/417 | (2006.01) |
| H01L 29/423 | (2006.01) |

(52) U.S. Cl.
CPC ...... H01L 29/7813 (2013.01); H01L 29/1095 (2013.01); H01L 29/404 (2013.01); H01L 29/407 (2013.01); H01L 29/66734 (2013.01); H01L 29/41766 (2013.01); H01L 29/42372 (2013.01)

(58) Field of Classification Search
CPC ............. H01L 29/7813; H01L 29/1095; H01L 29/66734; H01L 29/407
See application file for complete search history.

(56) References Cited

U.S. PATENT DOCUMENTS

| 7,989,321 B2 | 8/2011 | Chen et al. |
| 8,748,976 B1 | 6/2014 | Kocon et al. |
| 9,530,847 B2 | 12/2016 | Hirler et al. |

(Continued)

FOREIGN PATENT DOCUMENTS

| DE | 102005052734 A1 | 4/2007 |
| DE | 102014109924 B3 | 11/2015 |
| DE | 102014109846 A1 | 1/2016 |

*Primary Examiner* — Jay C Chang
*Assistant Examiner* — Mikka Liu
(74) *Attorney, Agent, or Firm* — Murphy, Bilak & Homiller, PLLC

(57) ABSTRACT

A semiconductor device includes a plurality of striped-shaped trenches extending into a semiconductor substrate. At least one trench of a first group of trenches of the plurality of striped-shaped trenches is located between two trenches of a second group of trenches of the plurality of striped-shaped trenches. A gate of a transistor structure is located in each trench of the second group of trenches and a gate insulation layer is located between the gate and the semiconductor substrate in each trench of the second group of trenches. Trench insulation material is located in each trench of the first group of trenches. A thickness of the trench insulation material throughout each trench of the first group of trenches is at least two times larger than a thickness of the gate insulation layer in each trench of the second group of trenches.

14 Claims, 5 Drawing Sheets

(56) References Cited

U.S. PATENT DOCUMENTS

| | | | |
|---|---|---|---|
| 2005/0167742 A1* | 8/2005 | Challa | H01L 21/3065 |
| | | | 257/328 |
| 2006/0049454 A1 | 3/2006 | Thapar | |
| 2006/0214221 A1* | 9/2006 | Challa | H01L 21/3065 |
| | | | 257/328 |
| 2009/0140327 A1 | 6/2009 | Hirao et al. | |
| 2009/0152624 A1 | 6/2009 | Hiller et al. | |
| 2009/0166720 A1* | 7/2009 | Zundel | H01L 29/402 |
| | | | 257/328 |
| 2011/0089527 A1 | 4/2011 | Blank | |
| 2011/0312166 A1 | 12/2011 | Yedinak et al. | |
| 2012/0061753 A1 | 3/2012 | Nishiwaki | |
| 2016/0020319 A1 | 1/2016 | Laforet et al. | |
| 2017/0213906 A1* | 7/2017 | Li | H01L 29/7813 |

\* cited by examiner

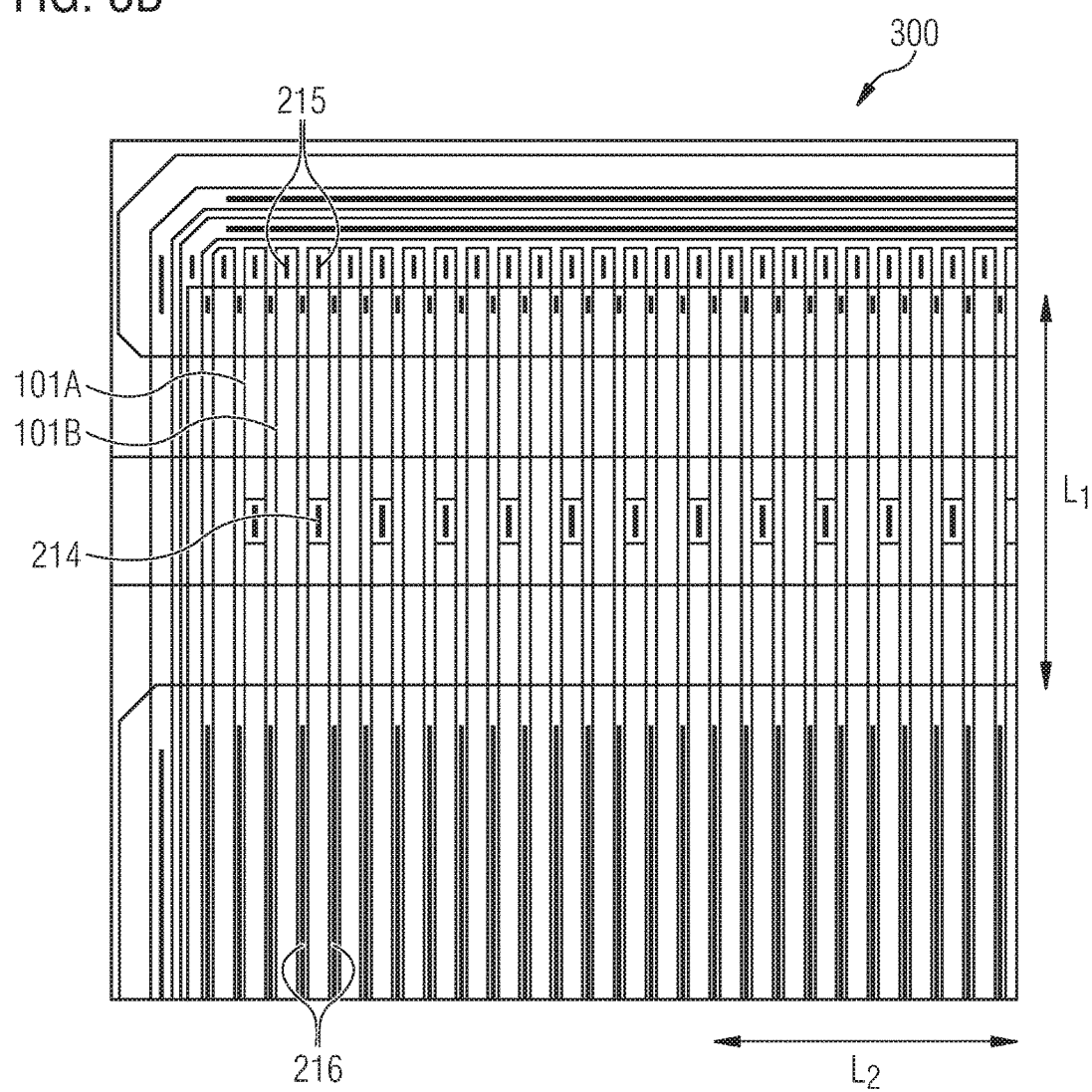

SEMICONDUCTOR DEVICES AND A METHOD FOR FORMING A SEMICONDUCTOR DEVICE

TECHNICAL FIELD

Embodiments relate to concepts for semiconductor device structures, and in particular to semiconductor devices and a method for forming a semiconductor device.

BACKGROUND

Semiconductor devices (e.g. semiconductor devices used for power applications may suffer from power losses due to excess or unwanted charges or capacitances, such as excess gate charges in high frequency applications and/or excess source-drain charges caused by electrodes at source potential.

SUMMARY

It is a demand to provide concepts for semiconductor devices with reduced charges, reduced capacitances and/or reduced power losses.

Such a demand may be satisfied by the subject matter of the claims.

Some embodiments relate to a semiconductor device. The semiconductor device comprises a plurality of striped-shaped trenches extending into a semiconductor substrate. At least one trench of a first group of trenches of the plurality of striped-shaped trenches is located between two trenches of a second group of trenches of the plurality of striped-shaped trenches. A gate of a transistor structure is located in each trench of the second group of trenches and a gate insulation layer is located between the gate and the semiconductor substrate in each trench of the second group of trenches. Trench insulation material is located in each trench of the first group of trenches. A thickness of the trench insulation material throughout each trench of the first group of trenches is at least two times larger than a thickness of the gate insulation layer in each trench of the second group of trenches.

Some embodiments relate to a further semiconductor device. The semiconductor device comprises a plurality of striped-shaped trenches extending into a semiconductor substrate. At least one trench of a first group of trenches of the plurality of striped-shaped trenches is located between two trenches of a second group of trenches of the plurality of striped-shaped trenches. Each trench of the first group of trenches comprises at least one electrically conductive trench structure less than a number of electrically conductive trench structures located in each trench of the second group of trenches.

Some embodiments relate to a method for forming a semiconductor device. The method comprises forming a plurality of striped-shaped trenches. At least one trench of a first group of trenches of the plurality of striped-shaped trenches is located between two trenches of a second group of trenches of the plurality of trenches. The method further comprises forming at least one electrically conductive trench structure in each trench of the first group of striped-shaped trenches and at least one electrically conductive trench structure in each trench of the second group of trenches. The number of electrically conductive trench structures formed in each trench of the first group of trenches is at least one less than the number electrically conductive trench structures formed in each trench of the second group of trenches.

Those skilled in the art will recognize additional features and advantages upon reading the following detailed description, and upon viewing the accompanying drawings.

BRIEF DESCRIPTION OF THE FIGURES

Some embodiments of apparatuses and/or methods will be described in the following by way of example only, and with reference to the accompanying figures, in which

FIGS. 3A and 3B show schematic illustrations of a cross-section and a top view of a semiconductor device including more than one gate located in each trench;

DETAILED DESCRIPTION

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the all to which example embodiments belong. It will be further understood that terms, e.g., those defined in commonly used dictionaries, should be interpreted as having a meaning that is consistent with their meaning in the context of the relevant art. However, should the present disclosure give a specific meaning to a term deviating from a meaning commonly understood by one of ordinary skill, this meaning is to be taken into account in the specific context this definition is given herein.

Figure 1:
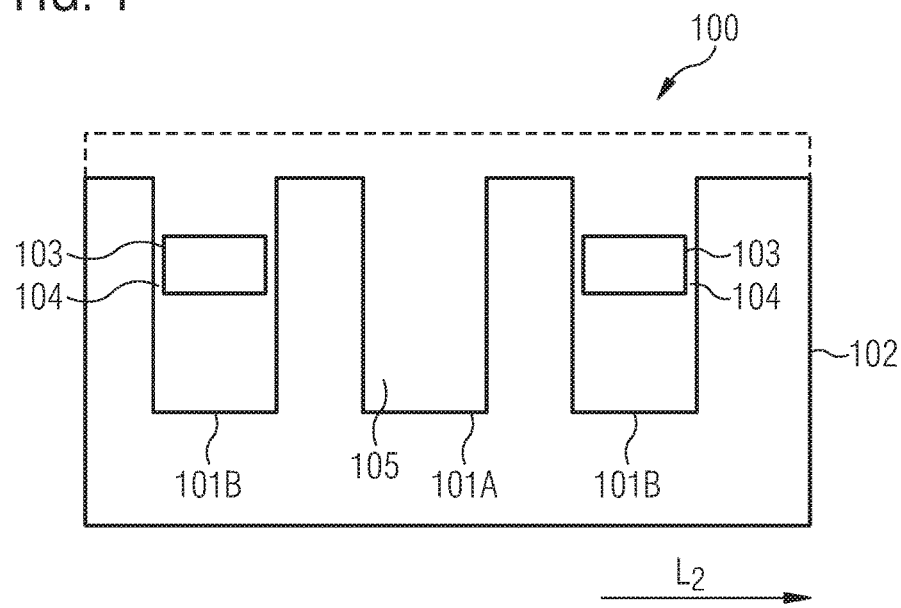
FIG. 1 shows a schematic illustration of a semiconductor device.

FIG. 1 shows a schematic illustration of a semiconductor device 100.

The semiconductor device 100 comprises a plurality of trenches extending into a semiconductor substrate 102. At least one trench 101A of a first group of trenches 101A of the plurality of trenches is located between two trenches 101B of a second group of trenches 101B of the plurality of trenches. A gate 103 of a transistor structure is located in each trench 101B of the second group of trenches 101B and a gate insulation layer 104 is located between the gate 103 and the semiconductor substrate 102 in each trench 101B of the second group of trenches 101B. Trench insulation material 105 is located in each trench 101A of the first group of trenches 101A. A thickness of the trench insulation material 105 throughout each trench 101A of the first group of trenches 101A is at least two times larger than a thickness of the gate insulation layer 104 in each trench 101B of the second group of trenches 101B.

Due to a thickness of the trench insulation material 105 throughout each trench 101A of the first group of trenches 101A being at least two times larger than a thickness of the gate insulation layer 104 in each trench 101B of the second group of trenches 101B, an electrode-free region which includes the trench insulation material 105 may be present in the trench 101A. Due to the electrode-free region being present in the trench, unwanted charges or capacitances from additional electrodes in the trench 101A may be avoided. For example, source-drain charges and/or gate charges may be reduced or avoided. Thus, power losses (e.g. in high frequency applications) may be reduced or avoided, for example.

The plurality of trenches may extend vertically into the semiconductor substrate from a first (or front) side surface of the semiconductor substrate 102. The plurality of trenches may have a vertical extension (e.g. a vertical depth). For example, the plurality of trenches may be laminar structures or may have the geometry of a wall or plate. The plurality of trenches 101 may be striped-shaped, and may be arranged substantially in parallel to each other (e.g. neglecting manufacturing tolerances) in the semiconductor substrate 102. Each trench of the plurality of trenches may include vertical sidewalls extending vertically into the semiconductor substrate and a trench bottom connecting the sidewalls of the trench.

The plurality of trenches may have a stripe-shape in a top view of the semiconductor device 100. A stripe-shape may be a geometry extending in a first lateral direction, L1, significantly farther than in an orthogonal second lateral direction, L2. For example, each trench of the plurality of trenches 101 may comprise a lateral length (in the first lateral direction, L1) of more than 10× (or more than 50× or more than 100×) a minimum (or smallest) lateral width (in the second lateral direction, L2) of the trench, for example. The lateral length of the trench 101 may be the largest extension along (or parallel to) a surface of the semiconductor substrate 102 and the minimum lateral width of the trench 101 may be a shortest dimension of the trench 101 extension along (or parallel to) the surface of the semiconductor substrate 102. All the trenches of the plurality of trenches may have the same lateral length and/or the minimum lateral width. Alternatively, the lateral length and/or the lateral width of the plurality of trenches may differ at least partly from each other. Optionally, all the trenches of the plurality of trenches may have identical geometries and/or lateral dimensions, for example.

The vertical extension (or depth) of the plurality of trenches may be shorter than the lateral length of each trench of the plurality of trenches 101, for example. For example, the minimum (or smallest) vertical extension of the plurality of trenches from the first (or front) side surface of the semiconductor substrate 102 into the semiconductor substrate 102 may be more than 1 μm (or e.g. more than 5 μm, or e.g. more than 10 μm, or e.g. more than 20 μm). Due to the trenches of the plurality of trenches having identical geometries, an average depth of the trenches 101A of the first group of trenches 101A may be equal to an average depth of the trenches 101B of the second group of trenches 101B. An average depth of the first group of trenches 101A may be a summation of a vertical dimension of each trench in the first group of trenches 101A divided by the number of trenches 101A of the first group of trenches 101A. Similarly, an average depth of the second group of trenches 101E may be a summation of a vertical dimension of each trench in the second group of trenches 101B divided by the number of trenches 101B of the second group of trenches 101B.

In a cross-section orthogonal to the lateral length (or the first lateral direction) of the stripe-shaped trenches 101 (as shown in FIG. 1), the stripe-shaped trenches may have a pillar shape, for example. A maximum (or largest) lateral width (in the second lateral direction, L2) of each trench of the plurality of trenches may be less than 2 μm (or e.g. less than 1 μm, or e.g. less than 800 nm, or e.g. less than 500 nm), for example. The width of each trench of the plurality of trenches may be a lateral dimension of the trench measured between two parallel sidewalls of each trench. The maximum width of each trench may be a characteristic maximum dimension measured between the sidewalls of more than 50% (or e.g. more than 60%) of a lateral length of the trench ignoring end portions of the trench, for example.

Neighboring or successive trenches of the plurality of trenches may be separated laterally from each other by a lateral distance. For example, a mesa region may be located between neighboring or successive trenches of the plurality of trenches. An average lateral distance (e.g. in the second lateral direction, L2) between neighboring or successive trenches of the plurality of trenches (or e.g. an average width of the mesa between neighboring or successive trenches) may be less than 2 times (or e.g. less than 1.5 times or e.g. less than 1 time) a minimum or smallest width of the trenches of the plurality of trenches.

The plurality of trenches may comprise (or may refer to, or may be) at least 10% (e.g. 10%, or e.g. 20%, or e.g. 30%, or e.g. 50%, or e.g. 70%, or e.g. 80%, or e.g. 90%, or e.g. 100%) of all trenches extending into the semiconductor substrate 102. Alternatively or optionally, the plurality of trenches 101 may comprise (or refer to) all trenches extending into the semiconductor substrate, for example.

A minimum (or smallest) thickness of the trench insulation material 105 throughout each trench 101A of the first group of trenches 101A may be at least two times larger (or e.g. at least 10 times larger, or e.g. at least 50 times larger) than a maximum (or largest) thickness of the gate insulation layer 104 in each trench 101B of the second group of trenches 101B. A thickness of the trench insulation material 105 may be a lateral thickness or a lateral dimension of the trench insulation material 105 measured in a direction substantially parallel to the second lateral direction, L2, for example. A thickness of the gate insulation layer 104 may be a lateral thickness or a lateral dimension of the gate insulation layer 104 measured in a direction substantially parallel to the second lateral direction, L2, between the gate and a body region (or a gate-controllable channel region) in the semiconductor substrate 102, for example.

Each gate 103 located in a trench 101B of the second group of trenches 101B may be located respectively at a gate location in each trench 101B of the second group of trenches 101B. A gate location may be defined by a vertical level of the gate 103 and a lateral position of the gate 103 along a lateral direction (e.g. second lateral direction, L2).

Each gate 103 of the trenches 101B of the second group of trenches 101B may be located respectively within each trench 101B of the second group of trenches 101B at the same vertical level (or position). For example, each gate 103 located in each trench 101B of the second group of trenches 101B may be located at the same vertical level (or position) as the gates 103 in other trenches 101B of the second group of trenches 101B. For example, all the gates 103 of the trenches 101B of the second group of trenches 101B may be located at the same vertical level (or position) as each other. For example, the bottom sides (e.g. back-facing sides) of the gates 103 of the trenches 101B of the second group of trenches 101B may be located at the same vertical level (or position) as each other.

Additionally, optionally or alternatively, each gate 103 located in a trench 101B of the second group of trenches 101B may be located at different lateral positions along the same lateral direction (e.g. second lateral direction, L2). For example, each gate 103 of the trenches 101B of the second group of trenches 101B may be located respectively within each trench 101B of the second group of trenches 101B along the same lateral plane (e.g. along a cross-sectional plane orthogonal to the lateral length and extending in the second lateral direction, L2). For example, each gate 103 located in each trench 101B of the second group of trenches 101B may be located along the same lateral plane. For example, all the gates 103 of the trenches 101B of the second group of trenches 101B may be located along the same lateral plane. For example, the mid-points (e.g. the middle points) of a lateral length (e.g. in the first lateral direction, L1) of the gates 103 of the trenches 101B of the second group of trenches 101B may be located along the same lateral plane as each other.

Each trench 101A of the first group of trenches 101A may include an electrode-free region. An electrode-free region may be any region in the trenches 101A of the first group of trenches 101A without (e.g. with no) electrodes. For example, no electrodes are located in the electrode-free regions of the trenches 101A of the first group of trenches 101A. Each electrode-free region of the trenches 101A of the first group of trenches 101A may be filled with the trench insulation material 105, for example. The trench insulation material 105 located in each trench 101A of the first group of trenches 101A may include silicon dioxide or silicon nitride, for example.

Instead of a gate located in each trench 101A of the first group of trenches 101A, at least part of an electrode-free region may be located in each trench 101A of the first group of trenches 101A at the same corresponding position at which a gate 103 is located in each trench 101B of the second group of trenches 101B. For example, at least part of the electrode-free region may have a location in each trench 101A of the first group of trenches 101A corresponding to a location of a gate 103 in each trench 101B of the second group of trenches 101B. For example, at least part of the electrode-free region may be located at a position (or location) in each trench 101A of the first group of trenches 101A which is the same as a location of a gate 103 in each trench 101B of the second group of trenches 101B.

Additionally, at least part of the electrode-free region located in each trench 101A of the first group of trenches 101A may have the same dimensions as the gates 103 located in the trenches 101B of the second group of trenches 101B. For example, at least part of the electrode-free region may have the same length (e.g. same dimension measured in the first lateral direction, L1), width (e.g. same dimension measured in the second lateral direction, L2) and height (e.g. same dimension measured in the vertical direction).

Additionally or optionally, at least part of each electrode-free region may be located in each trench 101A of the first group of trenches 101A at the same vertical level (or position) as the gate in each trench 101B of the second group of trenches 101B. Additionally or optionally, at least part of each electrode-free region may be located in each trench 101A of the first group of trenches 101A along the same lateral direction (or lateral plane) as the gate 103 in each trench 101B of the second group of trenches 101B.

Additionally or optionally, an average distance between at least part of each electrode-free region located in each trench 101A of the first group of trenches 101A and the semiconductor substrate 102 may be the same as (or equal to) an average distance between a gate 103 located in a trench 101B of the second group of trenches 101B and the semiconductor substrate 102. The average distance may be a summation of a number of distance measurements and divided by the number of measurements, for example. Each distance measurement may be a distance (measured in the second lateral direction, L2) between the gate 103 located in a trench 101B of the second group of trenches 101B and the semiconductor substrate 102, for example. Each distance measurement may be measured at different locations between a top side (or a front-facing side) of the gate and a bottom side (or a back-facing side) of the gate, for example.

A minimum length (in a first lateral direction L1) of the electrode-free region in each trench 101A of the first group of trenches 101A may be at least 10% (or e.g. at least 30%, or e.g. at least 50%) of the trench length of each trench 101A of the first group of trenches 101A.

Each trench 101A of the first group of trenches 101A may be gate-free. For example, no gates are located in each trench 101A of the first group of trenches 101A. A gate electrode structure (e.g. a gate metallization structure above the surface of the semiconductor substrate) may be electrically insulated from all or any electrodes located in the trenches 101A of the first group of trenches 101A, for example. None of the electrodes located in the first group of trenches 101A is electrically connected to the gate electrode structure, for example. For example, the gate electrode structure is not connected to any electrically conductive trench structures (e.g. any electrodes) in the trenches 101A of the first group of trench structures 101A.

The semiconductor device 100 may further include a field electrode located in each trench of the plurality of trenches. Each field electrode located in the plurality of trenches may be located respectively at a field electrode location in each trench of the plurality of trenches. Each field electrode location may be defined by a vertical level of the field electrode and a lateral position of the field electrode along a lateral direction (e.g. second lateral direction, L2). Each field electrode may be located respectively within each trench of the plurality of trenches at the same vertical level (or position). Additionally or optionally, each field electrode may be located respectively each trench of the plurality of trenches along the same lateral plane.

At least part of each field electrode may be located below a vertical level of the gates 103 located in the trenches 101B of the second group of trenches 101B. For example, the gate 103 and the field electrode may be located in (or e.g. within) each trench 101B of the second group of trenches 101B. However, only a field electrode (e.g. no gate) may be located in (or e.g. within each trench 101A of the first group of trenches 101A). For example, the field electrodes located in the trenches 101A of the first group of trenches 101A may be the only electrodes located in the trenches 101A of the first group of trenches 101A. The gate 103 and the field electrode may each extend laterally in the first lateral direction L1 (or e.g. in a direction substantially parallel to sidewalls of the trench 101B), for example. A material of the gate 103 and the field electrode may be polysilicon or a metal, for example.

Optionally, the whole or entire field electrode may be arranged below the gate 103 in each trench 101B of the second group of trenches 101B, for example. For example, the field electrode may be arranged between the gate 103 in the trench 101B and a bottom of the trench 101B. Additionally or optionally, the gate and the field electrode located in each trench 101B of the second group of trenches 101B may be electrically insulated from each other by trench insulation material located each trench 101B of the second group of trenches 101B. For example, the trench insulation material may be located vertically between the field electrode and the gate. Additionally or optionally, the trench insulation material may be located between the field electrode and sidewalls of the trench and/or between the field electrode and a bottom of the trench 101. Additionally or optionally, the trench insulation material may be located on the gates located in each trench 101B of the second group of trenches 101B. For example, the trench insulation material may fill portions of each trench 101B of the second group of trenches 101B above the gates.

Since the trenches 101A of the first group of trenches 101A are gate free, the trench insulation material 105 of the electrode-free region may fill portions of each trench 101A of the first group of trenches 101A above the field electrode. For example, the trench insulation material 105 of the electrode-free region may fill each trench 101A of the first group of trenches 101A from at least a top side (or front-facing side) of the field electrode to at least a surface level (e.g. at a the front side) of the semiconductor substrate 102. For example, a minimum vertical dimension of the electrode-free region of the trench 101A of the first group of trenches 101A from a front-facing side of the field electrode towards at least the surface level of the semiconductor substrate 102 may be at least 300 nm (or e.g. at least 500 nm, or e.g. at least 1 µm).

Additionally or optionally, the trench insulation material 105 of the electrode-free region located above the front-facing side of the field electrode may extend from a first sidewall of the trench 101A of the first group of trenches 101A to a second sidewall of the trench 101A of the first group of trenches 101A. Thus, an average thickness (or width) of the trench insulation material in the electrode-free region in trench 101A of the first group of trenches 101A above the front-facing side of the field electrode may be substantially equal to the trench width of each trench 101A of the first group of trenches 101A.

Additionally or optionally, the trench insulation material 105 of the electrode-free region in each trench 101A of the first group of trenches 101A may be located between the field electrode and sidewalls of each trench 101A and/or between the field electrode and a bottom of each trench 101A. A minimum (or smallest) thickness of the trench insulation material 105 between the field electrode and sidewalls of each trench 101A and/or between the field electrode and a bottom of each trench 101A may be at least two times larger (or e.g. at least 10 times larger) than a minimum (or smallest) thickness of the gate insulation layer 104 in each trench 101B of the second group of trenches 101B.

Additionally, alternatively or optionally, more than one gate (e.g. two gates) may be located in each trench 101B of the second group of trenches 101B. For example, a first gate of a first transistor structure and a second gate of a second transistor structure may be located in each trench 101B of the second group of trenches 101B. A first gate insulation layer may be located between the first gate of the first transistor structure and a body region of the first transistor structure in the semiconductor substrate. A second gate insulation layer may be located between the second gate of the second transistor structure and a body region of the second transistor structure in the semiconductor substrate. The first gate insulation layer and the second gate insulation layer may be located at opposite sidewalls of each trench 101B of the second group of trenches 101B, for example.

Instead of the entire field electrode being arranged below the gate in each trench 101B of the second group of trenches 101B, the field electrode may extend vertically towards a bottom of the trench from at least the vertical level of the first gate of the first transistor structure and the second gate of the second transistor structure. Additionally or optionally, at least a portion of the field electrode may be located laterally between the first gate of the first transistor structure and the second gate of the second transistor structure. The portion of the field electrode located laterally between the first gate of the first transistor structure and the second gate of the second transistor structure may be electrically insulated from the first gate of a first transistor structure and from the second gate of the second transistor structure by trench insulation material, for example. Additionally or optionally, a portion of the field electrode extending vertically below a vertical level of the first gate of the first transistor structure and the second gate of the second transistor structure may be laterally surrounded by trench insulation material. The trench insulation material may be located between the field electrode and sidewalls of the trench and/or between the field electrode and a bottom of the trench.

Additionally or optionally, a first portion of the electrode-free region may have a location in each trench 101A of the first group of trenches 101A corresponding to a location of the first gate in each trench 101B of the second group of trenches 101B. A second portion of the electrode-free region may have a location in each trench 101A of the first group of trenches 101A corresponding to a location of the second gate in each trench 101B of the second group of trenches 101B.

The semiconductor device 100 may include at least one transistor structure (or e.g. a plurality of transistor structures). A source region of the transistor structure and a body region of the transistor structure may be located in the semiconductor substrate. A gate 103 of a trench 101B of the second group of trenches 101B may be located adjacent to the body region of a transistor structure, for example.

Optionally, n number of trenches 101A of the first group of trenches 101A and m number of trenches 101B of the second group of trenches 101B may be arranged alternatingly in a lateral direction (e.g. in the second lateral direction, L2) along the semiconductor substrate 102. n and m may be integers greater than or equal to 1. For example, optionally, one, (or optionally more than one) trench 101A of a first group of trenches 101A may be located between two trenches 101B of the second group of trenches 101B. Alternatively, or optionally, n and m are both equal to 1. Optionally, n and m may have the same integer value (e.g. both n and m may be equal to 1 or, 2 or 3 or any integer). Optionally or alternatively, n and m may have different integer values (e.g. n may be equal to 2 an m may be equal to 3), for example.

Optionally, not more than one gate-controllable channel region (e.g. a body region) of a transistor structure may be located between a trench 101B of the second group of trenches 101B and a neighboring trench 101A of the first group of trenches 101A. For example, not more than one gate-controllable channel region of a transistor structure may be located between each trench 101B of the second group of trenches 101B and each neighboring trench 101A of the first group of trenches 101A.

The semiconductor device 100 may further include a source electrode structure (e.g. a source metallization structure) electrically connected to the field electrodes located in the trenches of the plurality of trenches. For example, the source electrode structure may be a source metallization layer structure for providing a source potential to the field electrodes located in the trenches 101A of the first group of trenches 101A and to the field electrodes located in the trenches 101B of the second group of trenches 101B, for example. Additionally or optionally, each field electrode may be electrically connected to the source electrode structure via at least one (e.g. two or e.g. three, or e.g. more than ten, or e.g. more than hundred) vertical electrically conductive structures. The at least one vertical electrically conductive structure may extend through the trench insulation material located in the plurality of trenches to the source electrode structure, for example.

The semiconductor device 100 may further include a gate electrode structure electrically connected to the gates 103 located in the trenches 101B of the second group of trenches 101B. The gate electrode structure may be a gate metallization layer structure for providing a gate potential to the gates located in the trenches 101B of the second group of trenches 101B. Additionally or optionally, the gate electrode structure may be a metallization (e.g. copper or aluminum) or polysilicon layer structure. Additionally or optionally, the source electrode structure may also be a metallization or polysilicon layer structure.

The gate electrode structure may be electrically insulated from the source electrode structure by electrically insulating material located between the gate electrode structure and the source electrode structure, for example. Additionally or optionally, each gate 103 may be electrically connected to the gate electrode structure via at least one vertical electrically conductive structure. The vertical electrically conductive structure may extend through the trench insulation material located in the second group of trenches 101B, for example.

The (or each) vertical electrically conductive structure may be a vertical via structure (e.g. a vertical connection), for example. The (or each) vertical electrically conductive structure may comprise tungsten (or may be a tungsten-based electrically conductive structure). Alternatively or optionally, the vertical electrically conductive structure may comprise (or may be formed from) copper or aluminum.

The semiconductor device 100 may further include an electrically insulating layer comprising electrically insulating material arranged adjacently to (e.g. directly adjacently to, or e.g. directly on) a surface (e.g. the first side surface) of the semiconductor substrate 102. The electrically insulating layer may be arranged on the front side surface of the semiconductor substrate 102. For example, the electrically insulating layer may cover a majority of the front side surface of the semiconductor substrate.

The electrically insulating layer may have a minimum (or smallest) thickness of between 200 nm and 1 μm (or e.g. between 200 nm and 800 nm), for example. The electrically insulating layer may electrically isolate (or electrically insulate) structures below the electrically insulating layer (e.g. doping regions, and/or the at least one electrically conductive trench structure located in the semiconductor substrate 102) from structures (e.g. electrode structures or metallization structures) above the electrically insulating layer, for example. The electrically insulating material of the electrically insulating layer may be an interlayer dielectric material (e.g. silicon nitride, or e.g. silicon dioxide, for example).

For example, the semiconductor device 100 may be a power semiconductor device having a breakdown voltage or blocking voltage of more than 10V (e.g. a breakdown voltage of 10 V, 20 V or 50V), more than 100 V (e.g. a breakdown voltage of 200 V, 300 V, 400V or 500V) or more than 500 V (e.g. a breakdown voltage of 600 V, 700 V, 800V or 1000V) or more than 1000 V (e.g. a breakdown voltage of 1200 V, 1500 V, 1700V, 2000V, 3300V or 6500V), for example.

The semiconductor device 100 may be a low voltage or medium voltage standard field effect transistor (e.g. an SFETLV or e.g. a SFETMV), for example. The semiconductor device 100 may be a metal oxide semiconductor field effect transistor (MOSFET) device, an insulated gate bipolar transistor (IGBT) device, or a junction field effect transistor (JFET) device, for example. For example, the semiconductor device 100 may include at least one MOSFET transistor structure, at least one IGBT transistor structure or at least one JFET transistor structure, for example.

In the case of the semiconductor device 100 including a MOSFET transistor structure or an IGBT transistor structure, each MOSFET or IGBT transistor structure may include a source or emitter region having a first conductivity type (e.g. n+ or n++ doped), a body region having a second conductivity type (e.g. p-type doped) and a drift region (e.g. n-type doped).

In the case of the semiconductor device 100 including a MOSFET transistor structure a drift region of the MOSFET transistor structure may be located between a body region of the MOSFET transistor structure and a drain region of the MOSFET transistor structure located at a second lateral side (e.g. a back side surface) of the semiconductor substrate 102. The drain region of the MOSFET transistor structure may have the first conductivity type (e.g. n+ or n++ doped), for example.

In the case of the semiconductor device 100 including an IGBT transistor structure, the drift region of the IGBT transistor structure may be located between a body region of the IGBT transistor structure and an emitter/collector region of the IGBT transistor structure located at the second lateral side (e.g. a back side surface) of the semiconductor substrate 102. The second emitter/collector region of the IGBT transistor structure may have the second conductivity type (e.g. p+ doped). Optionally, a highly doped field stop region having the first conductivity type (e.g. n+ doped) may be located between the drift region and the second emitter/collector region of the IGBT transistor structure.

The trenches of the plurality of trenches may extend vertically into the drift region towards the drain or collector region located at the second lateral side (back side surface) of the semiconductor substrate 102. For example, the trenches of the plurality of trenches may extend into the drift region by greater than 30% (or e.g. larger than 50%, or e.g. larger than 80%) of a vertical dimension of the drift region.

Optionally, a source or emitter region, the body region and/or the drift region of a transistor structure may be located adjacently to each trench of the plurality of trenches (e.g. adjacently to a sidewall of each trench of the plurality of trenches.

The gate 103 located in the trench 101B of the second group of trenches may be located laterally adjacent to the body region of the MOSFET or IGBT transistor structure. For example, the gate 103 may extend vertically from the front side surface of the semiconductor substrate 102 towards the drift region of the transistor structure.

The field electrode, located between the bottom of the trench and the gate may be located laterally adjacently to the drift region of the MOSFET or IGBT transistor structure, for example.

A region comprising the first conductivity type may be a p-doped region (e.g. caused by incorporating aluminum ions or boron ions) or an n-doped region (e.g. caused by incorporating nitrogen ions, phosphor ions or arsenic ions). Consequently, the second conductivity type indicates an opposite n-doped region or p-doped region. In other words, the first conductivity type may indicate a p-doping and the second conductivity type may indicate an n-doping or vice-versa.

The semiconductor substrate 102 may be a silicon-based semiconductor substrate (e.g. a silicon substrate). For example, the semiconductor substrate 102 may be float zone (FZ) silicon-based semiconductor substrate or a Czochralski (CZ) silicon-based semiconductor substrate. Optionally or alternatively, the semiconductor substrate 102 may be a silicon carbide (SiC)-based semiconductor substrate, or gallium arsenide (GaAs)-based semiconductor substrate, or a gallium nitride (GaN)-based semiconductor substrate, for example.

The first lateral surface or front side surface of the semiconductor substrate 102 may be a surface of the semiconductor substrate 102 towards metal layers, insulation layers and/or passivation layers on top of the surface of the substrate or a surface of one of these layers. For example, a semiconductor substrate 102 front side may be the side at which active elements of the chip are formed. For example, in a power semiconductor chip, a chip front side may be a side of the chip at which a source region and a gate region are formed, and a chip back side may be a side of the chip at which a drain region is formed. For example, more complex structures may be located at the chip front side than at the chip back side.

The examples described herein relate a drain region located at the chip back side and a source region located at the chip front side, it may be understood that the semiconductor device may include other configurations. For example, optionally, in a source-down configuration, a source/drain region may be located at the chip front side.

A lateral surface of the semiconductor substrate 102 may be a substantially even plane (e.g. neglecting unevenness of the semiconductor structure due to the manufacturing process and trenches). For example, the lateral dimension of the lateral surface of the semiconductor substrate 102 may be more than 100 times larger (or more than 1000 times or more than 10000 times) than a maximal height of structures on the main surface. In comparison to a basically vertical edge (e.g. resulting from separating the substrate of the chip from others) of the semiconductor substrate 102, the lateral surface may be a basically horizontal surface extending laterally. The lateral dimension of the lateral surface of the semiconductor substrate 102 may be more than 100 times larger (or more than 1000 times or more than 10000 times) than a basically vertical edge of the semiconductor substrate 102, for example.

The first lateral direction may be a direction substantially parallel to a lateral surface of the semiconductor substrate, for example. The second lateral direction may be a direction substantially parallel to the lateral surface of the semiconductor substrate, and orthogonal (or perpendicular) to the first lateral direction, for example. A vertical direction may be a direction orthogonal (or perpendicular) to the lateral surface of the semiconductor substrate, for example.

For discrete power MOSFETs, the gate charges may cause power losses in high frequency applications. For synchronous rectification applications the output charges may cause, in addition, power losses.

Deactivating a part of the gate electrode of the active cells may be a possible way of reducing the gate charge. The on resistance may also be increased by this measure but not in the same ratio at which the gate charge is reduced. A good tradeoff may be achieved if for each drift zone exactly one active channel is enabled instead of two channels for each drift zone in other SFET devices. For example, with SFET3 (e.g. 150 V, 200 V, 250 V or 300 V) technologies, the electrodes of every second trench may be connected to the gate potential, making sure that every drift zone has one active channel. The electrodes on source potential (e.g. the source electrodes in every second trench) may also contribute to the source-drain capacitance.

In a high speed semiconductor device, every field electrode (lower electrode) in each trench of the plurality of trenches may be electrically connected to source potential. The upper electrodes in the plurality of trenches may be alternatingly connected to source potential or gate potential. For example, only every second trench 101B may be connected to a gate via a gate contact. An upper electrode may be connected to source potential within every second trench.

In the semiconductor device 100, electrodes of the inactive channels are not put on source potential to avoid the adding of source-drain charges (Qsd charges). The electrodes are just removed in those regions completely. Thus, the gate charge of Power MOSFETs may be reduced by removing partly the gate electrodes within the device structure.

Figure 2A:
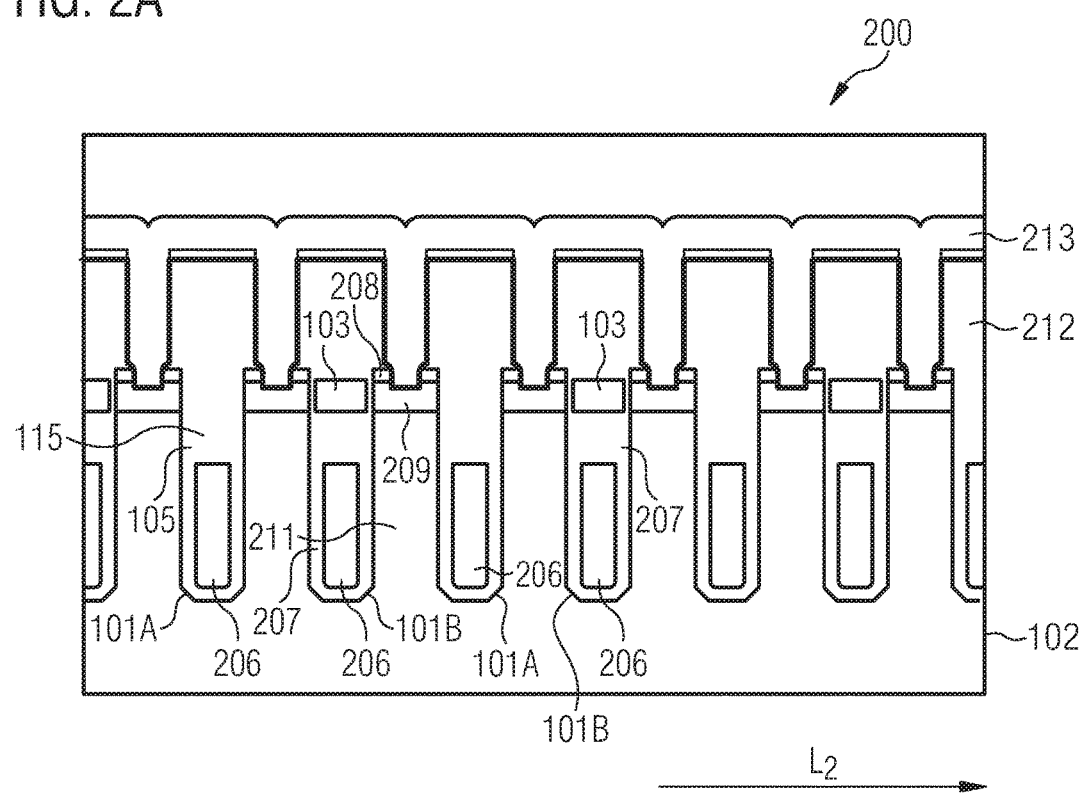
FIGS. 2A and 2B show schematic illustrations of a cross-section and a top view of a further semiconductor device.
Figure 2B:
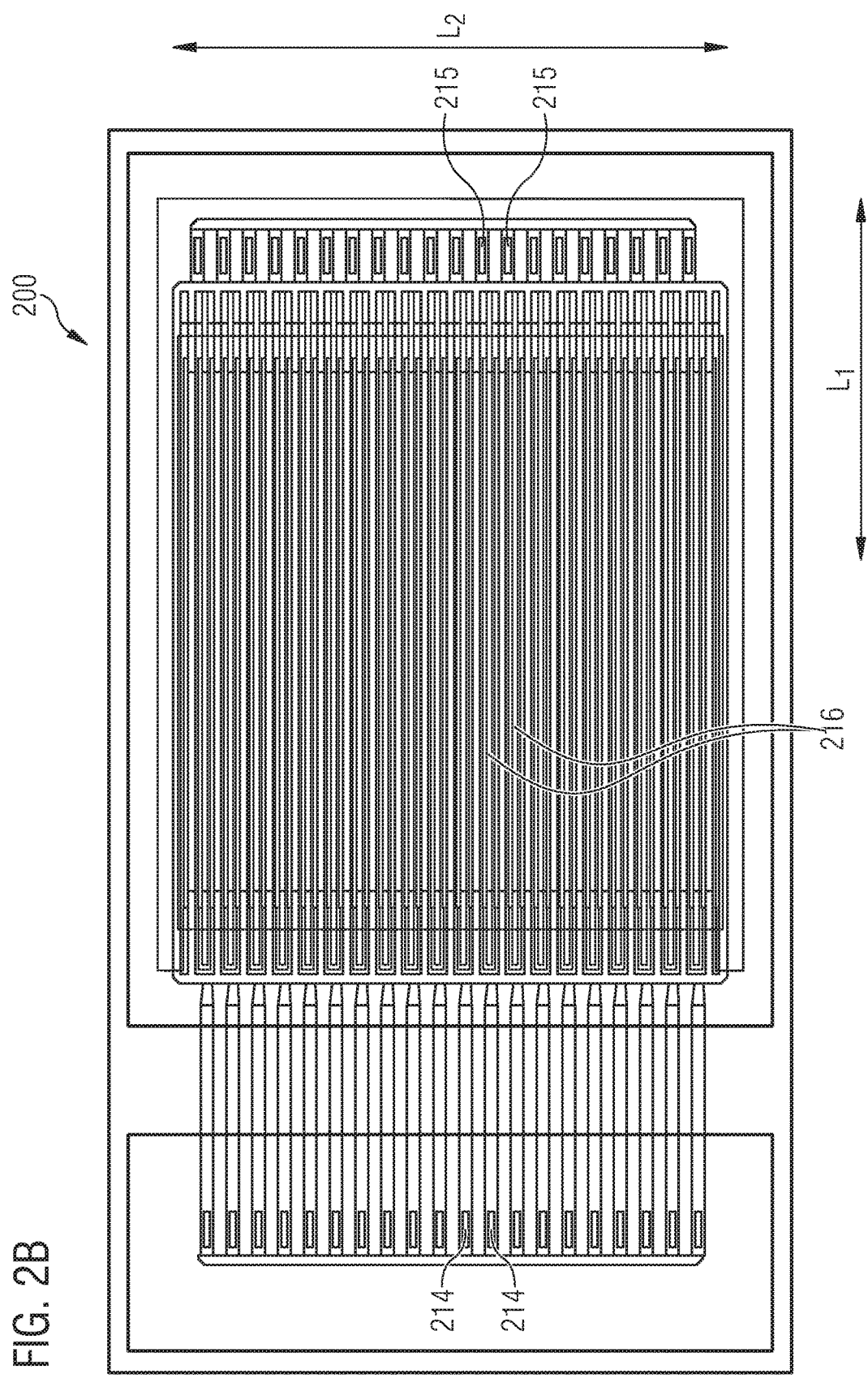

FIGS. 2A and 2B show schematic illustrations of a semiconductor device 200.

FIG. 2A shows a schematic illustration of a vertical cross-section of a semiconductor device 200.

The semiconductor device 200 (e.g. an SFET7 high speed variation) may include a field electrode 206 located in each trench of the plurality of trenches.

The gate 103 and the field electrode 206 may be located in (or e.g. within) each trench 101B of the second group of trenches 101B. The field electrode 206 may be arranged below the gate 103 in each trench 101B of the second group of trenches 101B, for example. For example, the field electrode 206 may be arranged between the gate 103 in the trench 101B and a bottom of the trench 101B.

Additionally or optionally, the gate 103 and the field electrode 206 located in each trench 101B of the second group of trenches 101B may be electrically insulated from each other by trench insulation material 207 located in each trench 101B of the second group of trenches 101B. For example, the trench insulation material 207 may be located vertically between the field electrode 206 and the gate 103. Additionally or optionally, the trench insulation material 207 may be located between the field electrode 206 and sidewalls of the trench and/or between the field electrode 206 and a bottom of the trench 101. Additionally or optionally, the trench insulation material 207 may be located on the gate 103 located in each trench 101B of the second group of trenches 101B. For example, the trench insulation material may fill portions of each trench 101B of the second group of trenches 101B above the gate 103.

Only a field electrode 206 (e.g. no gates) may be located in (or e.g. within) each trench 101A of the first group of trenches 101A. At least part of the electrode-free region (which may include or may be trench insulation material 106) may have a location in each trench 101A of the first group of trenches 101A corresponding to a location of a gate 103 in each trench 101B of the second group of trenches 10B. Since the trenches 101A of the first group of trenches 101A are gate free, the trench insulation material 105 of the electrode-free region may fill portions of each trench 101A of the first group of trenches 101A above the field electrode 206. For example, the trench insulation material 105 of the electrode-free region may fill each trench 101A of the first group of trenches 101A from at least a front-facing side of the field electrode 206 to at least a surface level of the semiconductor substrate 102. For example, a minimum vertical dimension of the electrode-free region of the trench 101A of the first group of trenches 101A from a front-facing side of the field electrode towards at least a surface level of the semiconductor substrate 102 may be at least 300 nm (or e.g. at least 500 nm, or e.g. at least 1 μm).

Optionally, the trench insulation material 105 located in the trenches 101A of the second group of trenches 101A may be the same material as the trench insulation material 207 located in the trenches 101B of the second group of trenches 101B.

A minimum length (in a first lateral direction L1) of the electrode-free region in each trench 101A of the first group of trenches 101A may be at least 10% (or e.g. at least 30%, or e.g. at least 50%) of the trench length of each trench 101A of the first group of trenches 101A.

Additionally or optionally, the trench insulation material 105 of the electrode-free region in each trench 101A of the first group of trenches 101A located above the front-facing side of the field electrode 206 may extend from a first sidewall of the trench 101A of the first group of trenches 101A to a second sidewall of the trench 101A of the first group of trenches 101A. Thus, a thickness of the trench insulation material 105 in the electrode-free region in trench 101A of the first group of trenches 101A above the front-facing side of the field electrode 206 may be equal to or conform to the trench width of each trench 101A of the first group of trenches 101A.

Additionally or optionally, the trench insulation material 105 of the electrode-free region in each trench 101A of the first group of trenches 101A may be located between the field electrode 206 and sidewalls of the trench and/or between the field electrode 206 and a bottom of the trench.

The semiconductor device 200 may include a plurality (or e.g. one or more) of transistor structures.

A source region 208 of a transistor structure of the plurality of transistor structures and the body region 209 of the transistor structure of the plurality of transistor structures may be located in the semiconductor substrate 102 adjacent to a trench 101B of the second plurality of trenches 101B.

The gate 103 of a trench 101B of the second group of trenches 101B may be located adjacent to a body region 209 of a transistor structure of the plurality of transistor structures, for example. The field electrode 206 located between the gate 103 and the bottom of each trench 101B of the second group of trenches and may be located laterally adjacently to the drift region 211 of the transistor structure, for example.

In the semiconductor device 200, one trench 101A of the first group of trenches 101A and one trench 101B of the second group of trenches 101B may be arranged alternatingly in a lateral direction (e.g. the second lateral direction. L2) along the semiconductor substrate. For example, one active channel is established in each drift region. For example, one gate-controllable channel region (e.g. a body region) of a transistor structure may be located between a trench 101B of the second group of trenches 101B and a neighboring trench 101A of the first group of trenches 101A.

The semiconductor device 200 may further include an electrically insulating layer 212 comprising electrically insulating material arranged adjacently to (e.g. directly adjacently to, or e.g. directly on) a surface (e.g. the first side surface) of the semiconductor substrate 102. The electrically insulating layer 212 may be arranged on the front side surface of the semiconductor substrate 102. For example, the electrically insulating layer 212 may cover a majority of the front side surface of the semiconductor substrate. The electrically insulating material of the electrically insulating layer 212 may be an interlayer dielectric material (e.g. silicon nitride, or e.g. silicon dioxide, for example). Additionally or optionally, the electrically insulating material of the electrically insulating layer 212 may be the same material as the trench insulation material 105 located in the trenches 101A of the first group of trenches 101A and/or the same material as the trench insulation material 207 located in the trenches 101B of the second group of trenches 101B.

The electrically insulating layer may have a minimum (or smallest) thickness of between 200 nm and 1 μm (or e.g. between 200 nm and 800 nm), for example. The electrically insulating layer may electrically isolate (or electrically insulate) structures below the electrically insulating layer (e.g. doping regions, and/or the at least one electrically conductive trench structure located in the semiconductor substrate 102) from structures (e.g. electrode structures or metallization structures) above the electrically insulating layer, for example.

The semiconductor device 200 may further include a source electrode structure 213. The source electrode structure 213 may be a source metallization layer structure for providing a source potential to the source region 208 of each transistor structure of the semiconductor device 200 (e.g. via one or more vertical electrically conductive structure, or e.g. via source pads). Additionally, the source electrode structure 213 may be electrically connected (via source fingers) to the field electrodes 206 located in the trenches of the plurality of trenches (e.g. electrically connected to the field electrodes 206 located in the trenches 101A of the first group of trenches 101A and to the field electrodes 206 located in the trenches 101B of the second group of trenches 101B), for example.

FIG. 2B shows a schematic illustration of a top view of the semiconductor device 200.

As shown in FIG. 2B, the field electrodes 206 located in the trenches of the plurality of trenches (e.g. the field electrodes 206 located in the trenches 101A of the first group of trenches 101A and to the field electrodes 206 located in the trenches 101B of the second group of trenches 101B)

may be electrically connected to a source electrode structure via a plurality of vertical electrically conductive structures (e.g. source fingers 215).

Between each trench of the plurality of trenches, the source region 208 of each transistor structure of the semiconductor device 200 may be electrically connected to the source electrode structure via at least one vertical electrically conductive structure (e.g. a source pad 216).

At each trench 101B of the second group of trenches 101B, a gate 103 may be electrically connected to a gate electrode structure via a vertical electrically conductive structure (e.g. a gate finger 214). As each trench 101A of the first group of trenches 101A is gate-free, the gate electrode is not connected to any electrodes located in each trench 101A of the first group of trenches 101A.

More details and aspects are mentioned in connection with the embodiments described above or below. The embodiments shown in FIGS. 2A and 2B may each comprise one or more optional additional features corresponding to one or more aspects mentioned in connection with the proposed concept or one or more embodiments described above (e.g. FIG. 1) or below (FIGS. 3A to 5).

Figure 3A:
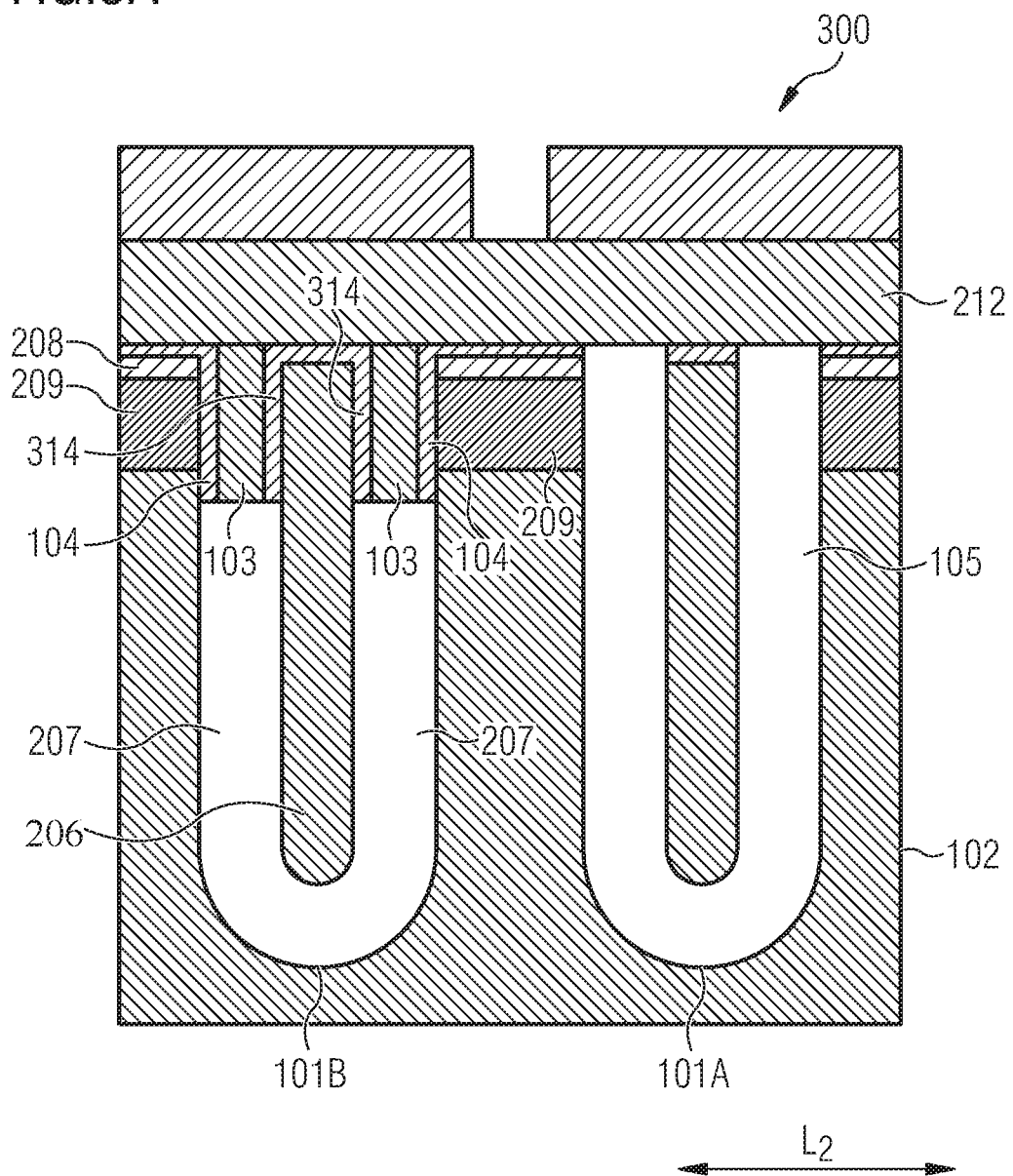

FIGS. 3A and 3B show schematic illustrations of a semiconductor device 300.

FIG. 3A shows a schematic illustration of a vertical cross-section of a semiconductor device 300 (e.g. an SFET 3).

As shown in FIG. 3A, more than one gate 103 (e.g. two gates 103) may be located in each trench 101B of the second group of trenches 101B. For example, a first gate 103 of a first transistor structure and a second gate 103 of a second transistor structure may be located in each trench 101B of the second group of trenches 101B. A first gate insulation layer 104 may be located between the first gate 103 of the first transistor structure and a body region 209 of the first transistor structure in the semiconductor substrate 102. A second gate insulation layer 104 may be located between the second gate 103 of the second transistor structure and a body region 209 of the second transistor structure in the semiconductor substrate 102. The first gate insulation layer 104 and the second gate insulation layer 104 may be located at opposite sidewalls of each trench 101B of the second group of trenches 101B, for example.

The field electrode 206 may extend vertically towards a bottom of the trench 101B from at least the same vertical level as the first gate 103 of the first transistor structure and the second gate 103 of the second transistor structure. Additionally or optionally, at least a portion of the field electrode 206 may be located laterally between the first gate 103 of the first transistor structure and the second gate 103 of the second transistor structure.

The portion of the field electrode 206 located laterally between the first gate 103 of the first transistor structure and the second gate 103 of the second transistor structure may be electrically insulated from the first gate 103 of a first transistor structure and from the second gate 103 of the second transistor structure by electrically insulating material 314 (which may be the same material as the trench insulation material and/or the same material as the gate insulation material), for example. Additionally or optionally, a portion of the field electrode 206 vertically below a vertical level of the first gate 103 of the first transistor structure and the second gate 103 of the second transistor structure may be laterally surrounded by trench insulation material 207. The trench insulation material 207 may be located between the field electrode 206 and sidewalls of the trench and/or between the field electrode 206 and a bottom of the trench.

A first portion of the electrode-free region may have a location in each trench 101A of the first group of trenches 101A corresponding to a location of the first gate 103 in each trench 101B of the second group of trenches 101B. A second portion of the electrode-free region may have a location in each trench 101A of the first group of trenches 101A corresponding to a location of the second gate 103 in each trench 101B of the second group of trenches 101B.

FIG. 3B shows a schematic illustration of a top view of the semiconductor device 300.

As shown in FIG. 3B, the field electrodes 206 located in the trenches of the plurality of trenches (e.g. the field electrodes 206 located in the trenches 101A of the first group of trenches 101A and to the field electrodes 206 located in the trenches 101B of the second group of trenches 101B) may be electrically connected to a source electrode structure via a plurality of vertical electrically conductive structures (e.g. source fingers 215).

Between each trench of the plurality of trenches, the source region of each transistor structure of the semiconductor device 200 may be electrically connected to the source electrode structure via at least one vertical electrically conductive structure (e.g. a source pad 216).

At each trench 101B of the second group of trenches 101B, a gate 103 may be electrically connected to a gate electrode structure via a vertical electrically conductive structure (e.g. a gate finger 214). As each trench 101A of the first group of trenches 101A is gate-free, the gate electrode is not connected to any electrodes located in each trench 101A of the first group of trenches 101A.

More details and aspects are mentioned in connection with the embodiments described above or below. The embodiments shown in FIGS. 3A and 3B may each comprise one or more optional additional features corresponding to one or more aspects mentioned in connection with the proposed concept or one or more embodiments described above (e.g. FIG. 1 to 2B) or below (FIGS. 4 to 5).

Figure 4:
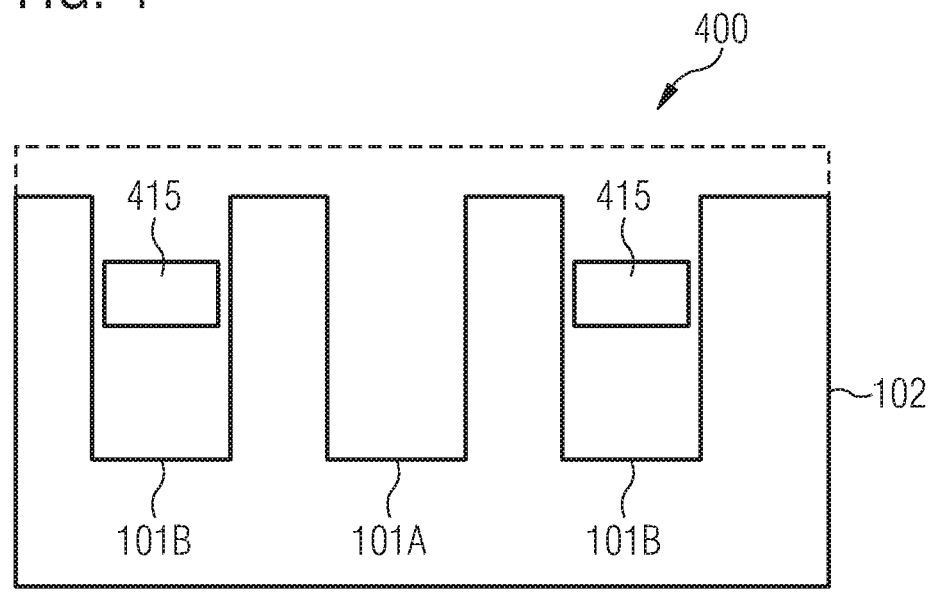
FIG. 4 shows a schematic illustration of a cross-section of a semiconductor device.
Figure 5:
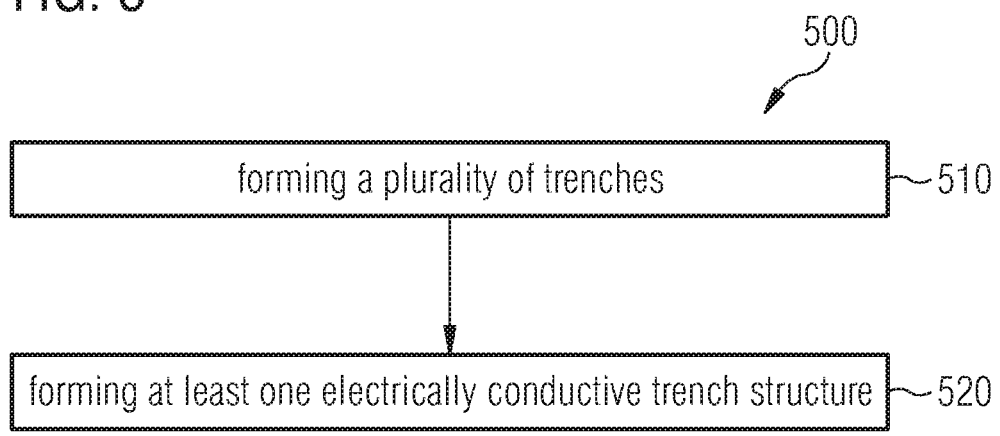
FIG. 5 shows a schematic illustration of a method for forming a semiconductor device

FIG. 4 shows a schematic illustration of a semiconductor device 400.

The semiconductor device 400 comprises a plurality of trenches extending into a semiconductor substrate 102. At least one trench 101A of a first group of trenches 101A of the plurality of trenches is located between two trenches 101B of a second group of trenches 101B of the plurality of trenches. Each trench 101A of the first group of trenches 101A comprises at least one electrically conductive trench structure less than a number of electrically conductive trench structures 415 located in each trench 101B of the second group of trenches 101B.

Due to each trench 101A of the first group of trenches 101A comprising at least one (e.g. one, or e.g. two) electrically conductive trench structure less than a number of electrically conductive trench structures 415 located in each trench 101B of the second group of trenches 101B, unwanted charges or capacitances from additional electrically conductive trench structures in the trench 101A may be avoided. For example, source-drain charges and/or gate charges may be reduced or avoided. Thus, power losses (e.g. in high frequency applications) may be reduced or avoided, for example.

The number of electrically conductive trench structures in each trench may be based on the number of different potentials (e.g. voltages) connected to (all) the electrodes (e.g. to individual electrodes, or e.g. to different electrode portions) in each trench. For example, the number of electrically conductive trench structures in each trench may be equal to the number of different potentials (e.g. voltages)

connected to (all) the electrodes in each trench. For example, in a trench, all electrodes which are gate electrodes (e.g. which are connected to a gate potential) may be considered to be (e.g. counted as) one electrically conductive trench structure. Additionally, in a trench, all electrodes which are field electrodes (e.g. which are connected to a source potential) may be considered to be one electrically conductive trench structure in the trench. For example, each trench 101B of the second group of trenches 101B may have two electrically conductive trench structures 415 (e.g. at least one gate electrode and at least one field electrode). For example, each trench 101A of the first group of trenches 101A may have one electrically conductive trench structure (e.g. at least one field electrode) since each trench 101A of the first group of trenches 101A is gate-free (or e.g. without gate electrodes). In this case, each trench 101A of the first group of trenches 101A may include one electrically conductive trench structure less than a number of electrically conductive trench structures 415 located in each trench 101B of the second group of trenches 101B.

Additionally, the number of electrically conductive trench structures formed in each trench 101A of the first group of trenches 101A may be different from the number electrically conductive trench structures 415 located each trench 101B of the second group of trenches 101B.

The semiconductor device 100 may further include a gate electrode structure electrically connected to the gates 103 located in the trenches 101B of the second group of trenches 101B. Since no gates are located in each trench 101A of the first group of trenches 101A, the gate electrode structure may be electrically insulated from all electrically conductive trench structures located in the trenches 101A of the first group of trenches 101A.

More details and aspects are mentioned in connection with the embodiments described above or below. The embodiments shown in FIG. 4 may comprise one or more optional additional features corresponding to one or more aspects mentioned in connection with the proposed concept or one or more embodiments described above (e.g. FIG. 1 to 3B) or below (FIG. 5).

FIG. 5 shows a flow chart of a method 500 for forming a semiconductor device.

The method 500 comprises forming 510 a plurality of trenches. At least one trench of a first group of trenches of the plurality of trenches is located between two trenches of a second group of trenches of the plurality of trenches.

The method 500 further comprises forming 520 at least one electrically conductive trench structure in each trench of the first group of trenches and at least one electrically conductive trench structure in each trench of the second group of trenches.

The number of electrically conductive trench structures formed in each trench of the first group of trenches is at least one less than the number electrically conductive trench structures formed in each trench of the second group of trenches.

Due to the number of electrically conductive trench structures formed in each trench of the first group of trenches being at least one less than the number electrically conductive trench structures formed in each trench of the second group of trenches, unwanted charges or capacitances from additional electrically conductive trench structures 415 in the trench 101A may be avoided. For example, source-drain charges and/or gate charges may be reduced or avoided. Thus, power losses (e.g. in high frequency applications) may be reduced or avoided, for example.

The method 500 may further include filling the trenches of the first group of trenches with trench insulation material at a location in each trench of the first group of trenches corresponding to a location of at least one electrically conductive trench structure in each trench of the second group of trenches.

For example, instead of an electrically conductive trench structure (e.g. a gate) located in each trench 101A of the first group of trenches 101A, each trench of the first group of trenches may be filled with trench insulation material at at least part of an electrode-free region located in each trench of the first group of trenches at the same corresponding position at which an electrically conductive trench structure (e.g. a gate) is located in each trench of the second group of trenches. For example, at least part of an electrode-free region (filled by the trench insulation material) may have a location in each trench of the first group of trenches corresponding to a location of a gate in each trench of the second group of trenches. For example, at least part of the electrode-free region (filled by the trench insulation material) may be located at a position (or location) in each trench of the first group of trenches which is the same as a location of a gate in each trench of the second group of trenches.

More details and aspects are mentioned in connection with the embodiments described above or below. The embodiments shown in FIG. 5 may comprise one or more optional additional features corresponding to one or more aspects mentioned in connection with the proposed concept or one or more embodiments described above (e.g. FIG. 1) or below.

Various examples relate to a high speed design of a field effect transistor (e.g. standard field effect transistors SFET) with a process option for minimal output capacitance.

Aspects and features (e.g. the semiconductor device, the plurality of trenches, the first group of trenches, the second group of trenches, the trench insulation material, the electrode-free region, the gate, the field electrode, the transistor structure, electrically conductive trench structure, the electrically insulating layer, the semiconductor substrate, the source electrode structure, the gate electrode structure, the vertical electrically conductive structure) mentioned in connection with one or more specific examples may be combined with one or more of the other examples.

Example embodiments may further provide a computer program having a program code for performing one of the above methods, when the computer program is executed on a computer or processor. A person of skill in the art would readily recognize that acts of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a plurality of striped-shaped trenches extending into a semiconductor substrate,
   wherein at least one trench of a first group of trenches of the plurality of striped-shaped trenches is located between two trenches of a second group of trenches of the plurality of striped-shaped trenches,
   wherein a gate of a transistor structure is located in each trench of the second group of trenches and a gate insulation layer is located between the gate and the semiconductor substrate in each trench of the second group of trenches,
   wherein a trench insulation material is located in each trench of the first group of trenches,
   wherein a thickness of the trench insulation material throughout each trench of the first group of trenches is at least two times larger than a thickness of the gate insulation layer in each trench of the second group of trenches,
   wherein each trench of the first group of trenches comprises an electrode-free region,
   wherein the electrode-free region occupies an equivalent location and volume in each trench of the first group of trenches as occupied by the gate in each trench of the second group of trenches,
   wherein at least part of a field electrode located in each trench of the first group of trenches is located below a vertical level of the gates located in the trenches of the second group of trenches.

2. The semiconductor device of claim 1, wherein an average depth of the trenches of the first group of trenches is equal to an average depth of the trenches of the second group of trenches.

3. The semiconductor device of claim 1, wherein at least part of each electrode-free region is located in each trench of the first group of trenches at the same vertical level as the gate in each trench of the second group of trenches.

4. The semiconductor device of claim 1, wherein at least part of each electrode-free region is located in each trench of the first group of trenches along the same lateral direction as the gate in each trench of the second group of trenches.

5. The semiconductor device of claim 1, wherein each electrode-free region of the trenches of the first group of trenches is filled with the trench insulation material.

6. The semiconductor device of claim 1, wherein each trench of the first group of trenches is gate-free.

7. The semiconductor device of claim 1, wherein the field electrodes located in the trenches of the first group of trenches are the only electrodes located in the trenches of the first group of trenches.

8. The semiconductor device of claim 1, further comprising a source electrode structure electrically connected to the field electrodes located in the trenches of the first group of trenches.

9. The semiconductor device of claim 1, wherein a field electrode located in each trench of the second group of trenches is located laterally between a first gate of a first transistor structure and a second gate of a second transistor structure located in each trench of the second group of trenches.

10. The semiconductor device of claim 1, wherein n trenches of the first group of trenches and m trenches of the second group of trenches are arranged alternatingly in a lateral direction along the semiconductor substrate, wherein n and m are integers greater than or equal to 1.

11. The semiconductor device of claim 1, wherein a blocking voltage of the semiconductor device is greater than 10 V.

12. The semiconductor device of claim 1, wherein the first group of trenches and the second group of trenches have identical geometries.

13. A semiconductor device, comprising:
   a plurality of striped-shaped trenches extending into a semiconductor substrate, wherein at least one trench of a first group of trenches of the plurality of striped-shaped trenches is located between two trenches of a second group of trenches of the plurality of striped-shaped trenches, wherein a gate of a transistor structure is located in each trench of the second group of trenches and a gate insulation layer is located between the gate and the semiconductor substrate in each trench of the second group of trenches, wherein a trench insulation material is located in each trench of the first group of trenches, wherein a thickness of the trench insulation material throughout each trench of the first group of trenches is at least two times larger than a thickness of the gate insulation layer in each trench of the second group of trenches, wherein a field electrode located in each trench of the second group of trenches is located laterally between a first gate of a first transistor structure and a second gate of a second transistor structure located in each trench of the second group of trenches.

14. A semiconductor device, comprising:

a plurality of striped-shaped trenches extending into a semiconductor substrate, wherein at least one trench of a first group of trenches of the plurality of striped-shaped trenches is located between two trenches of a second group of trenches of the plurality of striped-shaped trenches, wherein a gate of a transistor structure is located in each trench of the second group of trenches and a gate insulation layer is located between the gate and the semiconductor substrate in each trench of the second group of trenches, wherein a trench insulation material is located in each trench of the first group of trenches, wherein a thickness of the trench insulation material throughout each trench of the first group of trenches is at least two times larger than a thickness of the gate insulation layer in each trench of the second group of trenches, wherein each trench of the first group of trenches comprises an electrode-free region, wherein the electrode-free region occupies an equivalent location and volume in each trench of the first group of trenches as occupied by the gate in each trench of the second group of trenches, wherein a field electrode located in each trench of the second group of trenches is located laterally between a first gate of a first transistor structure and a second gate of a second transistor structure located in each trench of the second group of trenches.

* * * * *